United States Patent
Yates et al.

(10) Patent No.: US 7,858,979 B2
(45) Date of Patent: Dec. 28, 2010

(54) METHOD OF ALIGNING DEPOSITED NANOTUBES ONTO AN ETCHED FEATURE USING A SPACER

(75) Inventors: Colin D. Yates, Clackamas, OR (US); Christopher L. Neville, Portland, OR (US); Thomas Rueckes, Rockport, MA (US); Steven L. Konsek, Boston, MA (US); Mitchell Meinhold, Arlington, MA (US); Claude L. Bertin, Venice, FL (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 12/475,013

(22) Filed: May 29, 2009

(65) Prior Publication Data

US 2009/0243102 A1 Oct. 1, 2009

Related U.S. Application Data

(63) Continuation of application No. 11/304,871, filed on Dec. 14, 2005, now Pat. No. 7,541,216.

(60) Provisional application No. 60/689,398, filed on Jun. 9, 2005.

(51) Int. Cl.
*H01L 29/08* (2006.01)
*H01L 35/24* (2006.01)
*H01L 51/00* (2006.01)

(52) U.S. Cl. ............... 257/40; 257/77; 257/419; 257/E51.04

(58) Field of Classification Search ........... 257/40, 257/77, 419; 438/82, 99; 977/842, 746, 977/742
See application file for complete search history.

(56) References Cited

U.S. PATENT DOCUMENTS

| | | | |
|---|---|---|---|
| 6,645,861 B2 * | 11/2003 | Cabral et al. | 438/682 |
| 2005/0122775 A1 * | 6/2005 | Koyanagi et al. | 365/185.11 |
| 2007/0029612 A1 * | 2/2007 | Sandhu | 257/347 |

* cited by examiner

*Primary Examiner*—Chuong A Luu
*Assistant Examiner*—N. Doan
(74) *Attorney, Agent, or Firm*—Wilmer Cutler Pickering Hale and Dorr LLP

(57) ABSTRACT

A method of forming an aligned connection between a nanotube layer and a raised feature is disclosed. A substrate having a raised feature has spacers formed next to the side of the raised feature. The spacers are etched until the sidewalls of the raised feature are exposed forming a notched feature at the top of the spacers. A patterned nanotube layer is formed such that the nanotube layer overlies the top of the spacer and contacts a side portion of the raised feature in the notched feature. The nanotube layer is then covered with an insulating layer. Then a top portion of the insulating layer is removed to expose a top portion of the etched feature.

12 Claims, 4 Drawing Sheets

METHOD OF ALIGNING DEPOSITED NANOTUBES ONTO AN ETCHED FEATURE USING A SPACER

CROSS REFERENCE TO RELATED APPLICATIONS

This application is a continuation of and claims priority under 35 U.S.C. §120 to U.S. patent application Ser. No. 11/304,871, filed Dec. 14, 2005 and entitled Method of Aligning Deposited Nanotubes Onto an Etched Feature Using a Spacer, the entire contents of which are incorporated herein by reference, which claims priority under 35 U.S.C. §119(e) to U.S. Provisional Patent Application No. 60/689,398, filed Jun. 9, 2005, entitled Method of Aligning Deposited Nanotubes Onto An Etched Feature Using a Spacer, which is incorporated herein by reference in its entirety.

TECHNICAL FIELD

The invention described herein relates generally to nano-material layer fabrication and alignment processes. In particular, the invention relates to methods, processes, and structures enabling a carbon nanotube layer to be aligned with specific features formed on a semiconductor substrate.

BACKGROUND

Nano-materials and nanotechnologies are fast becoming a force in semiconductor technology. Nano-materials are generally described as materials whose fabrication scale is so small that the molecular properties of the materials begin to predominate over the bulk properties of the material.

In particular, carbon nanotube technologies are becoming a significant factor in electronic device construction. In one implementation, nano-materials comprise nanotubes. Single-wall carbon nanotubes (SWCNT) are quasi-one dimensional nanowires, which exhibit either metallic or semiconductor properties depending upon their chirality and radius. In some implementations, such carbon nanotubes are in the range of about 3-50 nanometers (nm) in diameter and several micrometers (µm) long. Single-wall nanotubes have been demonstrated as both semiconductor layers in thin film transistors as well as metallic interconnects between metal layers. Applications of carbon nanotube (CNT) electronic devices are compounding almost daily. Most notably are new CMOS transistors, non-volatile memory and backend interconnects.

Nanotubes can be deposited in layers or ribbons of materials to, for example, construct electrical connections or nanowires. One new area of implementation is that of non-volatile memory devices. One such application is described in U.S. Pat. No. 6,919,592 which is directed to hybrid circuits using nanotube electromechanical memory. This reference is hereby incorporated by reference for all purposes. This reference also describes in detail the methods of forming nanotube layers as known to those having ordinary skill in the art. A fuller description of the operation of these devices can be obtained in these and other related references.

The inventors point out that this is just but one of a myriad of potential applications for this extremely versatile technology. In many applications, the nanotubes form conductive layers that are is deposited onto substrates. During such fabrication of electrical structures, alignment issues for the deposition of nanotube layers become important.

FIGS. 1(a) and 1(b) depict a perfectly aligned carbon nanotube (CNT) layer 101 aligned against the side 102 of a metallization line 103. The problem with forming this structure using existing technologies is that it is dependent on extreme adherence to very narrow tolerances. Using alignment marks the CNT patterns are aligned to the metallization pattern to effect the alignment of the two structures.

In practice such alignment fails a significant portion of the time due to alignment errors. What is needed is a robust manufacturable process for aligning nanotubes with an associated metallization layer.

SUMMARY OF THE INVENTION

In accordance with the principles of the present invention, an improved fabrication process for aligning layers of nano-material with an etched feature is disclosed.

In general, this disclosure teaches methods to form nano-material layers that are aligned with adjacent raised features. Of particular interest to this disclosure are methods of aligning nanotube layers with conductive raised features such as metal layers, transistor gate stacks, and so on.

One embodiment of the invention comprises a method of forming a carbon nanotube electrical connection aligned with raised feature. The method involving forming a raised feature on a substrate surface wherein the feature includes a top surface and sides. Further, forming a spacer on a side of the raised feature. The spacer being shorter than the raised feature enabling the top portion of the raised feature to extend above the top of the spacer thereby exposing a portion of the side of the raised feature thereby defining a notched region above the spacer and adjacent to the top portion of the raised feature. A nanotube layer is deposited and patterned onto the substrate such that the nanotube layer is deposited in the notched region and contacts the exposed portion of the raised feature and overlaps a portion of the top of the raised feature. An insulating layer is formed on the substrate such that it covers the nanotube layer. Portions of the insulating layer are removed to expose a top portion of the etched feature and removing the nanotube layer from on top of the etched feature leaving a portion of the nanotube layer in contact with the etched feature.

In another embodiment, a carbon nanotube electrical connection to a raised feature is disclosed. The connection including a raised feature formed on a substrate. The raised feature having formed adjacent thereto spacer elements configured to expose a side portion of the raised feature and define a notched feature above the spacer. A nanotube layer is formed in contact with the side of the raised feature so that the nanotube layer overlaps the spacer and the notched portion. An insulating layer is on the substrate arranged to cover the nanotube layer and leave at least a portion of the top of the raised feature exposed.

These and other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In general, the present invention encompasses semiconductor manufacturing techniques that are used to align nano-material layers and nano-material ribbons with raised features. In some embodiments, the raised features comprise metallization lines, transistor gate stacks, and other raised conductive semiconductor features. Additionally, such nano-materials are specifically contemplated to include carbon nanotubes (CNT). In one particular embodiment, the raised feature is flanked by an adjoining spacer. The spacer is directly adjacent to a sidewall of the raised feature. Additionally, the spacer is formed shorter than the raised feature exposing a sidewall portion of the raised feature to define an exposed contact surface on the side of the raised feature. The spacer also defines a notched feature in the region above the spacer and adjacent to the exposed sidewall. Nano-materials are then deposited onto the surface covering the notched feature and importantly contacting the exposed sidewall of the raised feature. The nano-materials also can extend beyond the final desired endpoint for the pattern of nanomaterials. The nanomaterials are then covered with insulating materials. Then the top of the insulating material is removed. The removal of the insulating material generally exposes a top portion of the raised feature. Such construction results in satisfactory contact and alignment between the nanomaterial layer and the raised feature regardless of process alignment issues and concerns thereby resolving alignment issues.

Figure 1A:
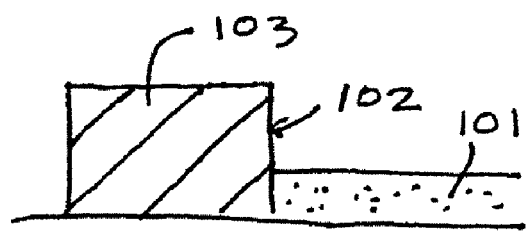
FIGS. 1(a) & 1(b) are simplified schematic depictions of a substrate having a nanotube layer aligned with a metal-containing layer.
Figure 1B:
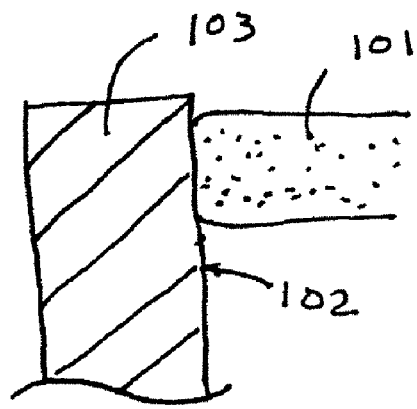
Figure 2:
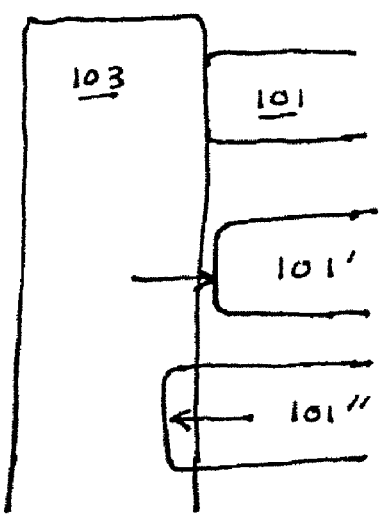
FIG. 2 is simplified plan view of a substrate illustrating some of the misalignment issues addressed by embodiments of the invention.

FIG. 2 illustrates some alignment problems facing a manufacturer today. A CNT ribbon 101 that is perfectly aligned and has good contact with metallization line 103 is shown at the interface between 101 and 103. Misaligned CNT ribbon 101' has drifted to the right (as indicated by the arrow) opening a space between the CNT ribbon 101' and the metallization line 103. This will lead to circuit failure. Misaligned CNT ribbon 101" has drifted to far too the left (as indicated by the arrow) causing an excessive amount of overlap onto the metallization line 103. This can lead to further process and alignment difficulties.

The inventors have discovered alternative fabrication processes which circumvent many of the difficulties in present processes.

Figure 3A:
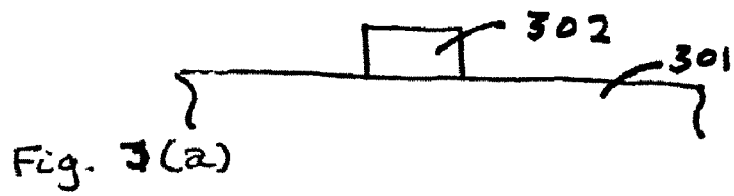
FIGS. 3(a)-3(f) depict a series of a simplified schematic section views of a process embodiment used to fabricate nanotube layers aligned with a raised feature using a spacer in accordance with the teachings of the invention.

FIGS. 3(a)-3(g) depict a process embodiment useful for constructing a aligned nanotube connection to an etched feature. FIG. 3(a) is a simplified schematic section view of a substrate 301 having a raised feature 302 formed thereon. The raised feature 302 can be a metallization layer (such as an interconnect or other conducting structure) or a transistor gate stack as well as a number of other raised features known to those having ordinary skill in the art. Although the raised feature is not limited to metal lines, the following discussion will be directed to a metal line embodiment. The depicted metal raised feature 302 can be constructed of any of a number of metal containing materials. Such materials can include but are not limited to aluminum, tungsten, tantalum, titanium, gold, silver, platinum, alloyed materials, metal nitrides, or multi-layered metal-containing structures containing many layers that can comprise more than one material. In one implementation, an aluminum metal layer 302 of 1000 Å (angstroms) or more thick can be formed. However, the applicants point out that a wide range of aluminum layer thicknesses can be employed. For example, ranging from about 400 Å to about 2 μm (micrometer).

In one embodiment, the raised metal layer 302 is formed by depositing a blanket metal layer and then pattern masking using a photoresist arranged in a mask pattern. The metal is then etched to form the desired feature. Depending on the embodiment, the feature 302 can be formed using isotropic etching or anisotropic etching. Methods of anisotropic etching to obtain nearly vertical sidewalls are known to those having ordinary skill in the art. By way of example, reactive ion etching (RIE) or other directional etch techniques can be employed. Chemical etch techniques as well as other isotropic techniques are also known to those having ordinary skill in the art and are accordingly not discussed here. Isotropic etch techniques can be used to obtain raised features that have sloped (rather than vertical) sidewall profiles. In some applications, such sloped profiles are advantageous. The exact etch techniques will vary depending on the metal materials used and substrate materials involved as well the final desired profile of the sidewalls. Additionally, in embodiments where the raised feature is a gate stack or other raised feature (of which many such types are known) the methods of construction are also well known.

Figure 3B:

Referring to FIG. 3(b), a layer 303 of insulating material is deposited onto the substrate. The insulating layer 303 covers the surface. The surface can of course be masked to pattern the insulating layer 303 is desired. In one embodiment, silicon dioxide is used as the insulative layer 303. Such layers are typical deposited at thicknesses in the range of about 100-600 Å. Thicker insulating layers 303 can also be employed. In one embodiment, a silicon dioxide insulating layer 303 of about 100 Å thick is employed. The inventors contemplate that other electrical insulating materials can of course be employed. Other such materials can include but are not limited to low-K dielectric materials, silicon nitride compounds, silicon oxynitrides, polyimides, as well as many other electrically insulative materials known to those having ordinary skill in the art. Particular low-K materials can include, but are not limited to: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-K materials include SiCOH or polymers of parylene and napthalene, copolymers of parylene with polysiloxanes or teflon, and polymers of polysiloxane. Other insulative materials include, but are not limited to, combinations of silicon dioxide and other doped dielectrics (e.g., BPSG, PSG).

Figure 3C:
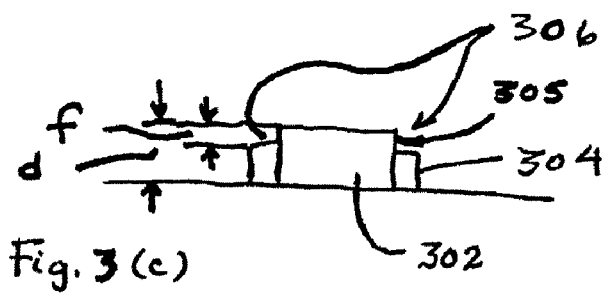

Referring now to FIG. 3(c), the insulating layer 303 is then subjected to etching to form spacers 304 and expose portions of the top of the raised layer 302. Isotropic and anisotropic etch techniques can be employed. In the depicted embodiment, an anisotropic etch is applied. Such etching yields nearly vertical walls on the spacers 304. It is important that the etching expose a portion of the sidewall 305 at the top of the raised feature 302. Also, in the depicted embodiment the top of the raised feature 302 is exposed. Generally, the etch techniques used will uniformly etch the layer 303 to remove the excess insulating material from the substrate leaving only spacers 304. This etch operation leaves a notched feature 306 that exposes a portion of the side wall 305 of raised feature 302. The spacer 304 is etched until the height of the spacer 304 is less than the height of the raised feature. Generally, it is preferable that the spacer height be at least as great as about half the thickness of the raised feature. In other words, in most implementations, the etching of the spacer 304 stops before it reaches more than half way down the raised feature height. This attribute is illustrated well in FIG. 3(c).

The exact amount of exposed sidewall 305 can be used to attenuate current passing into the raised feature from a subsequently formed nanotube structure (like a nanowire or ribbon of nanotubes). Greater etching exposes more sidewall increasing the current. Lesser etching exposes less of the sidewall decreasing the current. Thus, a combination of exposed sidewall height and thickness of a conducting nanotube layer can be used to modulate the amount of current through the associated junction.

The etch techniques used to remove the spacer materials will vary depending on the materials of the spacer, raised feature, and substrate involved, as well as the final desired height and profile of the spacer sidewalls. As explained previously, the depth f of the notched feature 306 is preferably less than about half the height d of the raised feature 302. In one example implementation, if a raised feature comprises an aluminum layer of about 1 µm thick and the insulative layer 303 comprises a silicon nitride layer about 200 Å thick, etching using an anisotropic etch process, for example an HBr and $SF_6O_2$ etchant combination like can result in a spacer about 800 Å high with a notched feature 306 exposing about 200 Å of the sidewall 305.

Subsequently, a layer of nanomaterials is deposited on the substrate and then patterned and etched into the desired pattern. Significantly, the nanomaterials overlap into the notched region 306 and onto the top of the raised feature an amount greater than the final desired amount of overlap. Commonly, the nano-material is comprised of carbon nanotubes. However, many other nano-materials known in the art can also be employed in accordance with the principles of the invention. Methods of forming such layers of carbon nanotubes are well known in the art and need not be discussed in detail here.

Figure 3D:
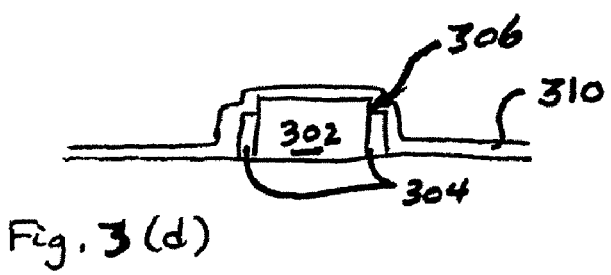

Referring to FIG. 3(d), the substrate 301 is shown with the raised feature 302 and spacers 304 in place. A layer 310 of carbon nano-tubes is deposited onto the substrate and then patterned and etched to form a ribbon 310 of CNT material in place on the raised feature 302. Methods of depositing such nanotube layers are well known to those having ordinary skill in the art and patterning as also well known. For example, photolithographic patterning can be used. The nanotubes cover the tops of the spacer and the top of the raised feature and also fill in the notched portion 306 between the spacer and sidewall. The sidewalls 305 of the raised features are also covered. The layer 310 of carbon nano-tubes is patterned and etched to form a ribbon 310 of CNT material that extends beyond a desired amount of overlap over the top of the raised feature. In this example, the ribbon completely overlaps the top of the raised feature and over a notched portion. Once the layer 310 of carbon nano-tubes has been etched into the appropriate pattern the photo mask is removed. Because the layer of carbon nano-tubes is delicate solvents are generally used to remove the photomask layer.

Figure 3E:
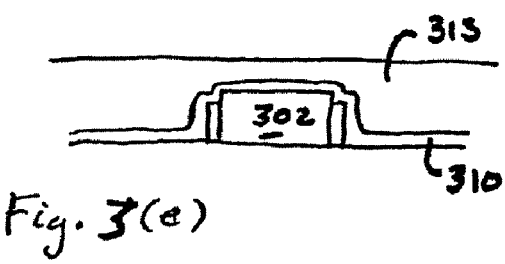

Referring to FIG. 3(e), the substrate 301 is then covered in an electrically insulative material. This insulating material 313 is layered thick enough to cover the CNT 310 and the raised feature 302 as well as portions of the substrate 301. One particularly useful embodiment uses silicon dioxide ($SiO_2$) as the insulating material 313. Of course, the inventors contemplate that any type of electrically insulating material can be employed to as the insulating material 313. Other commonly used insulative materials include but are not limited to porous $SiO_2$, FSG (fluorosilicate glasses), low-K dielectric materials, polyimides, and the like. In one non-limiting example embodiment, the layer 313 is about twice as thick as the thickness of the raised feature.

Figure 3F:
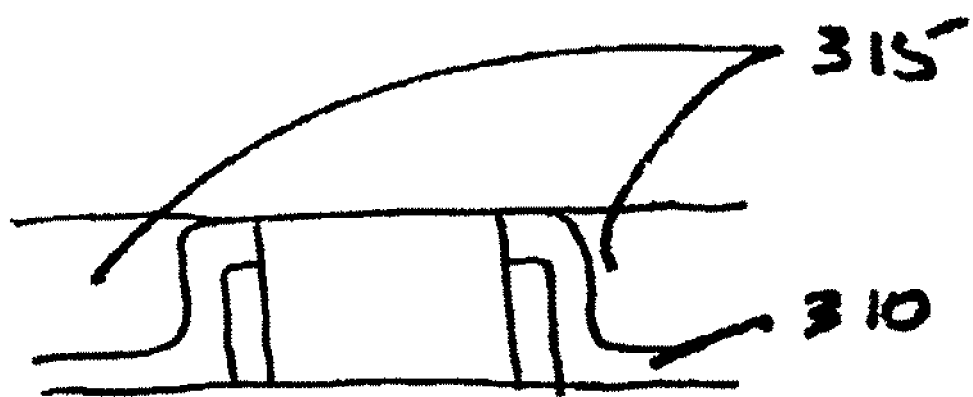

Once the CNT ribbon 310 is insulated, the excess insulative material is removed to form an insulative layer 315 and expose a portion of the metal layer if desired. Referring to FIG. 3(f), the excess insulating material is removed to form insulating layer 315. The CNT 310 remains in good electrical contact with the sidewalls of the raised feature 302 in the notched portions. Additionally, the insulating layer 315 provides good insulation for the buried CNT layer 310. The excess insulating material can be removed using techniques such as etching which is conducted until the top of the raised feature is exposed. Alternatively CMP (chemical mechanical polishing techniques can be employed) can be employed with the top of the raised feature operating as a CMP stop layer. The amount of contact between the raised feature and the nanotubes is determined by the size of sidewall exposed in the notched portion and also the amount planarization of the top surface. For example, the planarization can continue until the notched portion 303 is thinned. As a result, the final structure will have reduced contact.

Figure 4A:
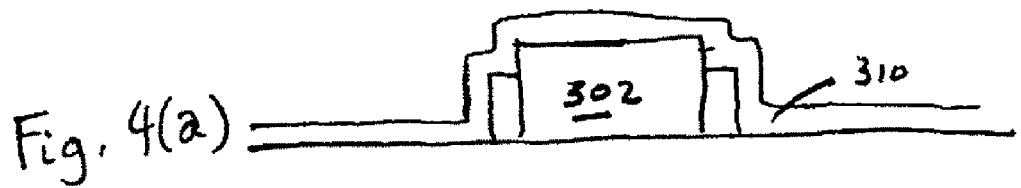
FIGS. 4(a)-4(d) depict another series of a simplified schematic section views of another process embodiment used to fabricate nanotube layers aligned with the raised feature in accordance with the teachings of the invention.

FIGS. 4(a)-4(d) provide a simplified schematic illustration of another approach wherein only one side of the raised feature is connected to a nanotube connection. The substrate depicted in FIG. 4(a) is essentially the same as shown and discussed with respect to FIG. 3(d). The inventors point out, that although depicted here with spacers on two sides, the spacer need only be formed on one side of the raised feature if desired.

Figure 4B:
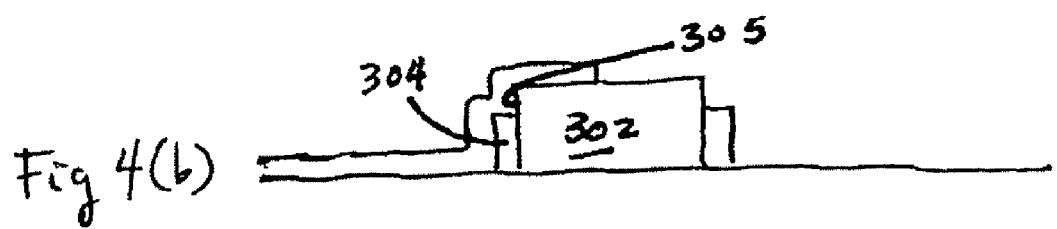

Once formed, the layer 310 of deposited carbon nano-tubes can be patterned and etched to form a ribbon 310 of carbon nanotubes (CNT). FIG. 4(b) shows the patterned CNT ribbon 310 in place on the surface including the exposed sidewall 305 of the metal layer 302 and the top of the raised feature 302. The CNT ribbon 310 extends beyond the desired amount of overlap. In this example, the desired amount of overlap is no overlap (i.e., the ribbon is to extend over the spacer 304 to the sidewall 305 and no further). Once the layer 310 of carbon nano-tubes has been etched into the appropriate pattern the photo mask is removed. Because the layer of carbon nano-tubes is delicate, solvent is generally used to remove the photomask layer.

Figure 4C:
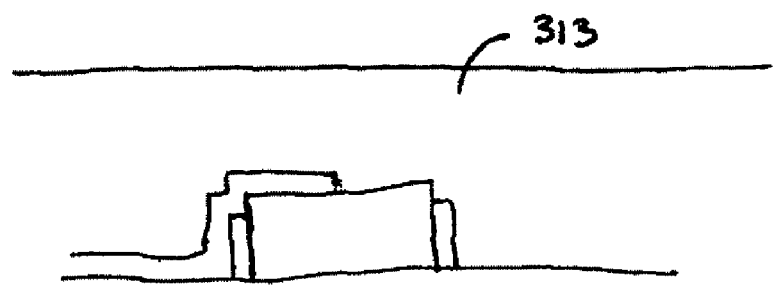

Referring to FIG. 4(c), the substrate 301 is then covered in an electrically insulative material 313. As before, the insulating layer 313 covers the CNT 310 and the exposed portions of the raised feature 302 as well as portions of the substrate 301. Again, silicon dioxide ($SiO_2$) is a useful insulating layer 313. Of course, the inventors point out that the electrically insulating material can be other insulative materials including, but are not limited to, porous $SiO_2$, FSG (fluorosilicate glasses), low-K dielectric materials, polyimides, and the like.

Figure 4D:
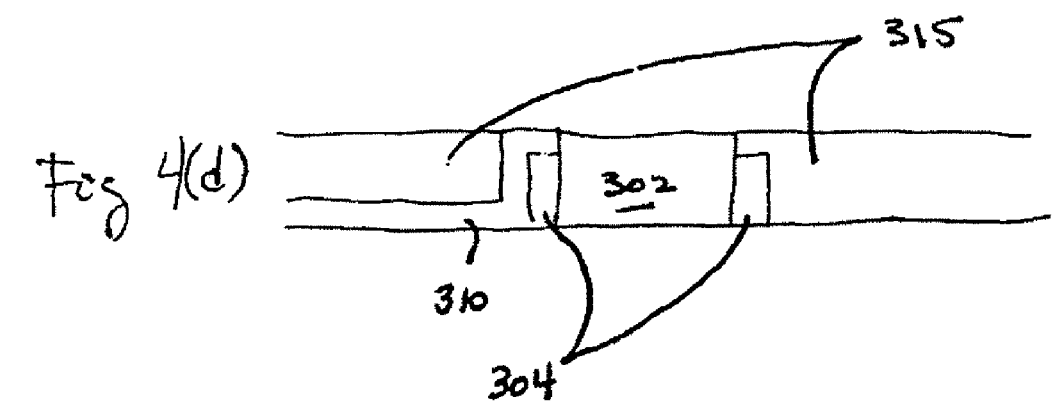

Once the CNT ribbon 310 is insulated, the excess insulative material is removed to form an insulative layer and expose a portion of the metal layer if desired. Referring to FIG. 4(d), the excess insulating material is removed to form insulating layer 315. The CNT 310 remains in good electrical contact with the sidewalls 305 of the raised feature 302. As before, the excess insulating material can be removed using etching, CMP, or other techniques until the top of the raised feature layer is exposed. Alternatively, the material can be further removed until a desired thickness of nanotubes is achieved. In this way the current can be attenuated.

Some of the advantages realized by some embodiments of the invention include, but are not limited to, a wider tolerance for misalignment between the raised feature and nanotube layers. Especially, the methodologies described herein are capable of dealing with line width variation in metal lines caused by imperfections in lithography processes. Also, the described processes are more resilient to alignment failures in the various fabrication processes.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Although only a few variations and configurations are expressly disclosed herein, it should be appreciated by anyone having ordinary skill in the art that, using the teachings disclosed herein, many different implementations can be employed and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

What is claimed is:

1. A carbon nanotube electrical connection to a raised feature, the connection comprising:
   a raised feature formed on a substrate, the raised feature having a top portion, and a sidewall;
   a sidewall spacer formed next to the sidewall of the raised feature and exposing a portion of the sidewall near the top of the raised feature, thereby defining a notched region above the spacer;
   a nanotube layer formed on the substrate such that the nanotube layer contacts an exposed portion of the sidewall and overlies the spacer in the notched region; and
   an insulating layer on the substrate that covers the nanotube layer and leaves a portion of the top of the raised feature exposed.

2. The carbon nanotube electrical connection of claim 1, wherein the raised feature comprises a raised metallization layer.

3. The carbon nanotube electrical connection of claim 1, wherein the raised feature comprises a transistor gate stack.

4. The carbon nanotube electrical connection of claim 1, wherein the raised feature comprises a metal-containing material.

5. The carbon nanotube electrical connection of claim 4, wherein the metal-containing material comprises a material selected from among aluminum, tungsten, tantalum, and titanium.

6. The carbon nanotube electrical connection of claim 4, wherein the metal-containing material comprise a metal alloy.

7. The carbon nanotube electrical connection of claim 4, wherein the metal-containing material comprises a metal nitride.

8. The carbon nanotube electrical connection of claim 1, wherein the raised feature comprises more than one layer of metal-containing material.

9. The carbon nanotube electrical connection of claim 1, wherein the notched region extends downward exposing no more than half of the height of the side of the raised feature.

10. The carbon nanotube electrical connection of claim 1, wherein the raised feature is formed using chemical mechanical polishing.

11. The carbon nanotube electrical connection of claim 1, the raised feature is formed using etching.

12. The carbon nanotube electrical connection of claim 1, wherein the insulating layer comprises silicon dioxide.

* * * * *